(12) United States Patent
Lu

(10) Patent No.: US 6,616,496 B1
(45) Date of Patent: Sep. 9, 2003

(54) METHOD OF FORMING A POLYIMIDE-ISOLATING WALL OF REVERSE-TRAPEZOID CROSS-SECTION WITH ELECTRIC, THERMAL AND MECHANICAL STABILITY

(75) Inventor: Tien-Rong Lu, Tainan (TW)

(73) Assignee: Ritdisplay Corporation, Hsin Chu (TW)

(*) Notice: Subject to any disclaimer, the term of this patent is extended or adjusted under 35 U.S.C. 154(b) by 0 days.

(21) Appl. No.: 09/593,670

(22) Filed: Jun. 14, 2000

(51) Int. Cl.[7] .............................................. H05B 33/10
(52) U.S. Cl. ......................................... 445/24; 313/504
(58) Field of Search ................................. 313/504, 505; 445/24

(56) References Cited

U.S. PATENT DOCUMENTS

| | | | | |
|---|---|---|---|---|
| 5,701,055 A | * | 12/1997 | Nagayama et al. | ......... 313/504 |
| 5,962,970 A | * | 10/1999 | Yokoi et al. | ................. 313/505 |
| 6,025,461 A | * | 2/2000 | Chiang et al. | ............... 528/353 |
| 6,069,443 A | * | 5/2000 | Jones et al. | ................. 313/504 |
| 6,306,559 B1 | * | 10/2001 | Tanamura et al. | .......... 313/504 |
| 6,373,187 B1 | * | 4/2002 | Nagayama et al. | ......... 313/504 |

OTHER PUBLICATIONS

Report NA/4, National Industrial Chemicals Notification and Assessment Scheme, Feb. 18, 1991, pp. 1–9.

* cited by examiner

Primary Examiner—Kenneth J. Ramsey

(57) ABSTRACT

A method of forming a polyimide-isolating wall including the steps of: a coating process for coating a photosensitive-polyimide isolating wall on an organic electroluminescent display panel; a prebaking process; an exposure process; a post-exposure baking process; a developing process for shaping the polyimide-isolating wall as a reverse-trapezoid cross section; and a curing process for making the polyimide-isolating wall possess electric, thermal and mechanical stability.

9 Claims, 2 Drawing Sheets

METHOD OF FORMING A POLYIMIDE-ISOLATING WALL OF REVERSE-TRAPEZOID CROSS-SECTION WITH ELECTRIC, THERMAL AND MECHANICAL STABILITY

BACKGROUND OF THE INVENTION

1. Field of the Invention

The present invention relates to a method of forming a polyimide-isolating wall, more particularly, to a method of forming a polyimide-isolating wall with a reverse-trapezoid cross-section that possesses electric, thermal and mechanical stability.

2. Description of Related Art

Currently, an organic electroluminescent display (OEL) panel with light weight, high contrast, wide view angle, fast response speed, low power consumption and high brightness has become the focus of the innovative display panels. However, there are many difficulties to be overcome in the commercialization and mass production of an OEL panel.

Generally, the OEL panel comprises a plurality of ITO anodes, a plurality of photoresist-isolating walls perpendicularly positioned on the anodes, an OEL layer positioned between two adjacent photoresist isolating walls on the anodes, and a plurality of cathodes positioned on the OEL layer. The anodes and the cathodes sandwich the OEL layer to form a luminescent pixel of the OEL panel. However, the ordinary photoresist materials often release out the residual solvents or moisture to the sealed space of the OEL panel. The released residual solvents or moisture further damage the OEL layer and thereby reduce the quality and lifetime of the panel.

In the technology disclosed in U.S. Pat. Nos. 5,701,055 and 5,952,037, a photoresist (OFPR-8000 offered by Tokyo Ohka Co. ltd) with unsatisfied electric, thermal and mechanical stability is taught to act as isolating walls to isolate anodes and cathode materials. The electric thermal and mechanical stability of the photoresists disclosed in U.S. Pat. Nos. 5,701,055 and 5,952,037 is not good enough and often causes bad lminescent stability and failure of the panel. On the other hand, the luminescence of the OEL panel is driven by a high electric current. The high electric currents and frequent switch operations of the OEL panel further deteriorates the photoresist isolating walls by inducing continuously liberation of harmful substances such as residual moisture and solvents. The degradation of the isolating walls will bring about a short circuit or failure in luminescence and reduce the lifetime of the OEL panel.

In addition, the photoresist isolating walls having approximately rectangular cross-section were obtained after performing the exposure process by a mask and the developing process on the ordinary photoresist material. The cathod materials diffuse laterally and thereby possibly contact the anodes during the follow-up deposition of the cathode materials. This will also lead to a short circuit on the panel. Though a multi-layer structure with reverse-trapezoid section has been previously disclosed in published patents, the procedure of fabricating multi-layer isolating walls is complicated and expensive. The process of multi-layer isolating walls is not feasible in the mass production of the OEL panel.

SUMMARY OF THE INVENTION

The object of the present invention is to provide a method of forming a polyimide-isolating wall with a reverse-trapezoid cross-section that possesses electric, thermal and mechanical stability and thereby improves the quality and lifetime of an OEL display panel.

In a preferred embodiment, the present invention provides a method of forming a polyimide-isolating wall with a reverse-trapezoid section on an OEL display panel. The panel comprises a substrate and a plurality of first electrodes. In the present invention, a coating process is firstly performed to coat a photosensitive-polyimide (PSPI) isolating layer on the panel. Then, a prebaking process, an exposure process, a post-exposure baking (PEB) process and a developing process are performed on the isolating layer in sequence to form the polyimide-isolating wall with the reverse-trapezoid cross-section. Finally, a high temperature curing process is performed on the polyimide-isolating wall with the reverse-trapezoid cross-section to ensure electric, thermal and mechanical stability that thereby improves the stability and lifetime of the OEL display panel.

The OEL display panel can be applied to any purpose or apparatus for displaying images, pictures, symbols and characters. The preferred purpose is used as a display of television, computer, printer, screen, vehicle, signal, communication apparatus, telephone, interactive electronic book, microdisplay, fishing apparatus, personal digital assistant, game, airplane and game goggle.

It is an advantage of the present invention that the method of forming the polyimide-isolating wall with the reverse-trapezoid cross-section can isolate cathode materials and anodes and meet the mass production requirements. The polyimide-isolating wall with the reverse-trapezoid cross-section provides with good comparability and interface adhesion with the under pixel-defining layer of polymide. Also, the polyimide-isolating wall with electric, thermal and mechanical stability can ensure the luminescent stability of the OEL panel.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
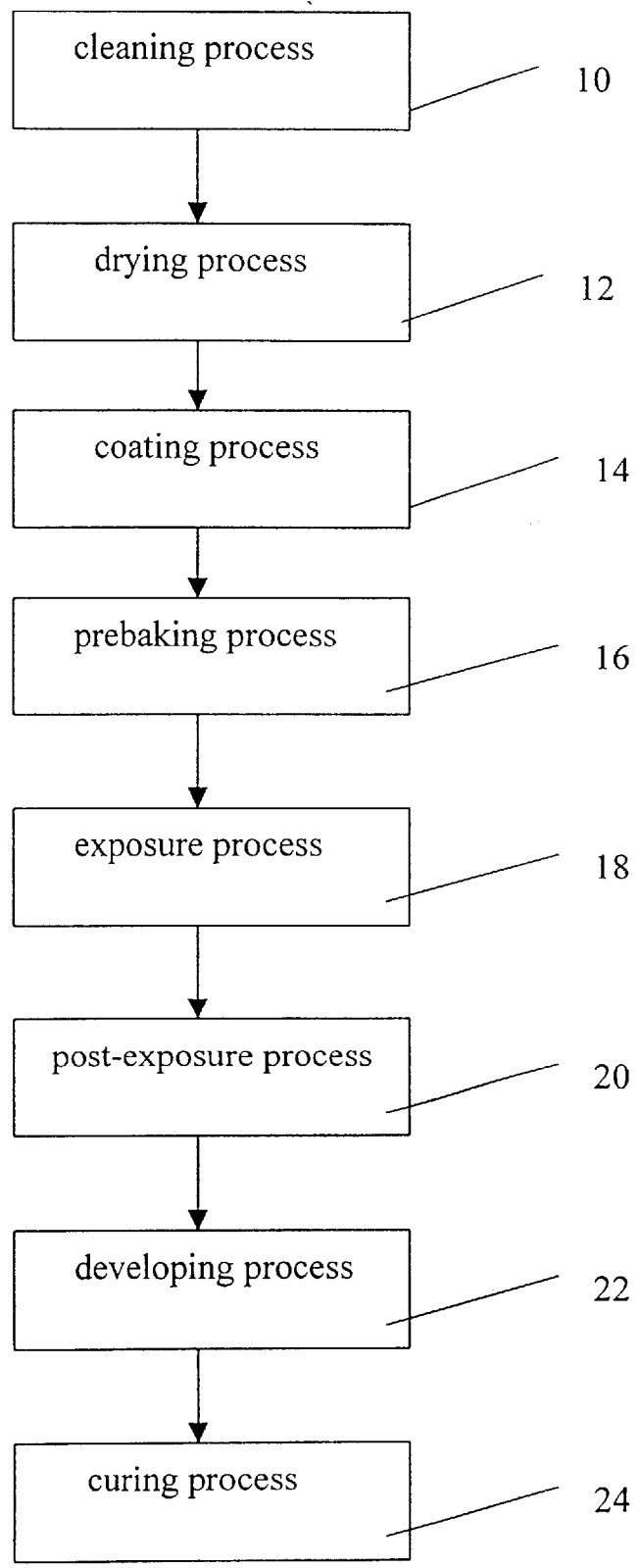
FIG. 1 is a flowchart of a method according to an embodiment of the present invention.

FIG. 1 is a flowchart of a method according to an embodiment of the present invention. The present invention provides a method for forming a polymide-isolating wall with a reverse-trapezoid cross-section on anodes of an OEL panel to be a self-supporting shadow mask in subsequent evaporation.

Firstly, a cleaning process 10 and a baking process 12 are performed on the panel in sequence to rinse and dry the panel. Then, an ion generator is employed to remove the static electricity on the panel against the discharge damage of panel. Next, a coating process 14 is performed to 6 coat a photosensitive-polyimide (PSPI) isolating layer on the panel. Next, a prebaking process 16 is performed on the panel to liberate the solvents in the isolating layer. Afterwards, an exposure process is performed by a mask on the isolating layer to form a light-diffusing gradient between the top and bottom of the isolating layer. Then a post-exposure baking (PEB) process 20 is performed to restructure the isolating layer. Next, a developing process 22 is performed to dissolve part of the isolating layer that does receive light and thereby form a pattern of the polyimide-isolating wall. Since the top of the isolating layer absorbs sufficient energy in the exposure process 18, the crosslinking of the top is stronger. On the contrary, the crosslinking of the bottom is weaker since the bottom of the isolating layer absorbs insufficient energy due to the obstacle of thickness. Accordingly, the bottom part is dissolved more than the top part in the developing process 22 so as to shape the polyimide-isolating wall as the reverse-trapezoid cross-section. Finally, a high temperature curing process 24 is performed to heat the polyimide-isolating wall at a temperature between 220° C. and 450° C. This hardens the polyimide-isolating wall with complete crosslinking and which thereby possesses electric, thermal and mechanical stability. It is good for promoting luminescent stability and lifetime of the OEL display panel.

Compared with the prior art, in the method of the present invention, the PSPI isolating layer is a negative photoresist layer that can be dissolved and patterned only by the developing process 22 without other photoresist steps such as coating, developing and stripping. Also, the developing process 22 utilizes the fact that the crosslinking and dissolving rate of each part of the PSPI isolating wall are changed according to thickness to form the reverse-trapezoid cross-section. It can reduce the material-consumption cost and meet mass production requirements. Furthermore, using the polymide-isolating wall of a reverse-trapezoid cross-section as a self-supporting shadow mask can rudimentarily prevent the anodes from contacting the cathode materials that laterally diffuse in the follow-up evaporation. By the way, a pixel-defining layer can be formed between the polyimide-isolating wall and the anodes to define the luminescent pattern of the anodes and completely isolate the anodes and the cathode materials that lateral diffuse. The polyimide-isolating wall with the reverse-trapezoid cross-section also provides good comparability and interface adhesion with the under pixel-defining layer of polymide. This will further avoid a short circuit and ensure the luminescent performance of the OEL display panel.

In another embodiment of the present invention, a polyimide precursor can substitute for the photosensitive polyimide-isolating layer in the coating process 14 and then proceed the prebaking process 16, the exposure process 18, the post-exposure baking process 20 and the developing process 22 in sequence. The polyimide precursor forms a polyamic acid in the post-exposure baking process 20, and that further crosslinks in the high temperature curing process 24 provide the polyimide-isolating wall of a reverse-trapezoid cross-section with electric, thermal and mechanical stability.

Figure 2:
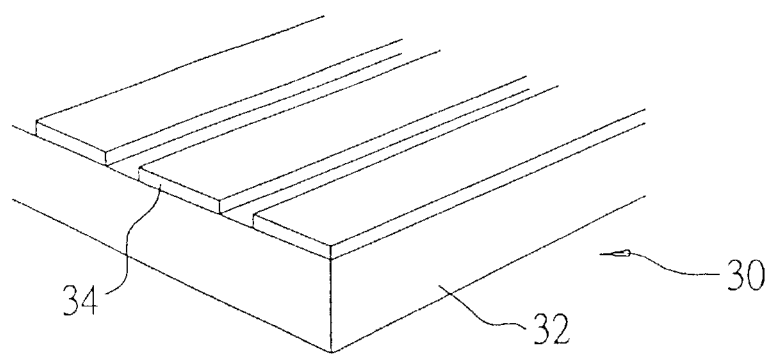
FIG. 2 to FIG. 4 are schematic diagrams of the method of forming a polyimide-isolating wall with a reverse-trapezoid cross-section according to an embodiment of the present invention.
Figure 3:
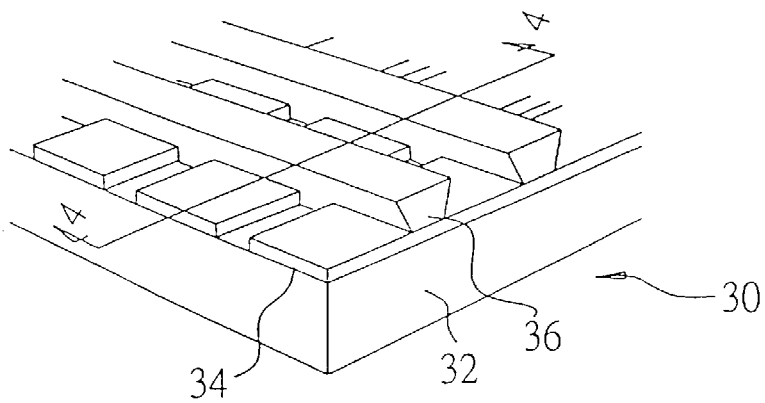
Figure 4:
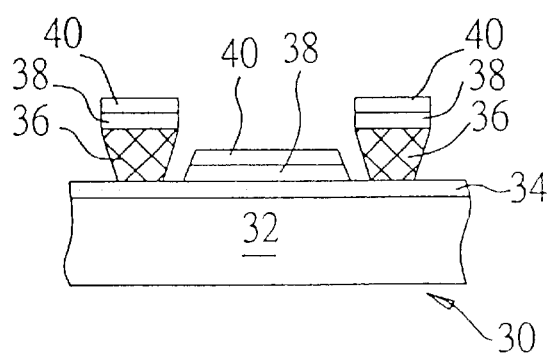

FIG. 2 to FIG. 4 are schematic diagrams of the method of forming a polyimide-isolating wall 36 with a reverse-trapezoid cross-section according to the present invention. The method of the present invention is applied to form a polyimide-isolating wall 36 with a reverse-trapezoid cross-section on an OEL display panel 30. As shown in FIG. 2, the panel 30 comprises a transparent substrate 32, and a plurality of anodes 34 in parallel positioned on the substrate 32 corresponding to luminescent areas. According to the flow-chart shown in FIG. 1, the panel 30 proceeds by the steps: cleaning process 10, baking process 12, coating process 14 (coating a photosensitive polyimide-isolating layer or a polyimide precursor), prebaking process 16, exposure process 18, post-exposure baking process 20, developing process 22 and curing process 24. Since the crosslinking is stronger at the top and the dissolution rate is quicker at the bottom, the developing process 22 forms the polyimide-isolating wall 36 with a reverse-trapezoid cross-section. The high temperature curing process 24 is performed to heat the polyimide-isolating wall 36 at a temperature between 220° C. and 450° C. This hardens the polyimide-isolating wall 36 with complete crosslinking and which thereby possesses electric, thermal and mechanical stability. It is good for luminescent stability and lifetime of the panel 30. As shown in FIG. 3, the polyimide-isolating wall 36 is formed as a plurality of parallel strips that is perpendicularly positioned on the plurality of anodes 34.

As shown in FIG. 4 (the cross-section diagram along line 3—3 of the panel 30 shown in FIG. 3), an OEL layer 38 and a plurality of cathodes 40 are then evaporated on the anodes 34 between two adjacent strips of the polyimide-isolating wall 36 in sequence, wherein the cathodes 40 are perpendicular to the anodes 34. The anode 34 and the cathode 40 sandwich the OEL layer 38 to form a luminescent pixel of the OEL display panel. The polyimide-isolating wall 36 with electric, thermal and mechanical stability can improve luminescent stability of the panel 30. Also, after high temperature curing there is no residual solvent or moisture liberated from the polyimide-isolating wall 36 to damage the OEL layer 38, and the lifetime of the panel 30 is thereby increased.

Figure 5:
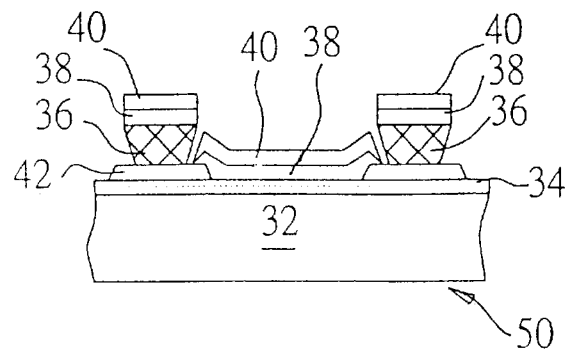
FIG. 5 is a schematic cross-section diagram of another organic electroluminescent display panel according to an embodiment of the present invention.

FIG. 5 is a schematic cross-section diagram of another OEL display panel 50 according to the present invention. In the cause of further preventing the anodes 34 from being contacted by the cathode materials, a pixel-defining layer 42 is formed between the anode 34 and the polyimide-isolating wall 36. The pixel-defining layer 42 not only defines a luminescent pattern of the anodes 34, but also completely isolates the anodes 34 and the cathode materials that laterally diffuse. The polyimide-isolating wall with the reverse-trapezoid cross-section also provides good comparability and interface adhesion with the under pixel-defining layer of polymide. This avoids a short circuit and thereby ensures the luminescent quality of the panel 50.

Although the present invention has been explained in relation to its preferred embodiments, it is to be understood that many other possible modifications and variations can be made without departing from the spirit and scope of the invention as hereinafter claimed.

What is claimed is:

1. A method of forming a polyimide-isolating wall with a reverse-trapezoid cross-section on an organic electroluminescent display panel that comprises a substrate and a plurality of first electrodes, comprising:

performing a coating process to coat a photosensitive-polyimide (PSPI) isolating layer on the panel;

performing a prebaking process on the isolating layer;

performing an exposure process on the isolating layer after the prebaking process;

performing a post-exposure baking (PEB) process on the isolating layer after the exposure process;

performing a developing process on the isolating layer after the post-exposure baking process to form the polyimide-isolating wall with the reverse-trapezoid cross-section; and performing a curing process on the polyimide-isolating wall with the reverse-trapezoid cross-section;

wherein the polyimide-isolating wall with the reverse-trapezoid cross-section possesses electric, thermal and mechanical stability and thereby improves luminescent stability and lifetime of the panel.

2. The method as claimed in claim 1, wherein the PSPI isolating layer is a negative photoresist layer.

3. A method of forming a polyimide-isolating wall with a reverse-trapezoid cross-section on an organic electroluminescent display panel that comprises a substrate and a plurality of first electrodes, comprising:

performing a coating process to coat a a polyimide precursor layer on the panel;

performing a prebaking process on the a polyimide precursor;

performing an exposure process on the a polyimide precursor layer after the prebaking process;

performing a post-exposure baking (PEB) process on the a polyimide precursor layer after the exposure process;

performing a developing process on the a polyimide precursor layer after the post-exposure baking process to form the polyimide-isolating wall with the reverse-trapezoid cross section; and performing a curing process on the polyimide-isolating wall with the reverse-trapezoid cross-section;

wherein the polyimide-isolating wall with the reverse-trapezoid cross-section possesses electric, thermal and mechanical stability and thereby improves luminescent stability and lifetime of the panel.

4. The method as claimed in claim 1, wherein the curing process brings about a further cross-linking structure in the polyimide-isolating layer with the reverse-trapezoid cross-section.

5. The method as claimed in claim 1, wherein the curing process is performed at a temperature between 220° C. and 450° C.

6. The method as claimed in claim 1, wherein the polyimide-isolating wall is formed as a plurality of parallel strips that is perpendicularly positioned on the plurality of first electrodes.

7. The method as claimed in claim 1, wherein the organic electroluminescent display panel further comprises a pixel-defining layer positioned on the plurality of first electrodes for defining a luminescent pattern of the first electrodes.

8. The method as claimed in claim 1, wherein the organic electroluminescent display panel is applied to a microdisplay.

9. The method as claimed in claim 1, wherein the substrate is made of silicon.

* * * * *